US012800646B2

(12) United States Patent
Hung

(10) Patent No.: US 12,800,646 B2
(45) Date of Patent: Nov. 17, 2026

(54) METHOD FOR DETERMINING WHETHER TOUCH PANEL IS APPLICABLE TO FIRMWARE AND TOUCH SENSITIVE PROCESSING APPARATUS AND TEST TOUCH SYSTEM THEREOF

(71) Applicant: EGALAX_EMPIA TECHNOLOGY INC., Taipei City (TW)

(72) Inventor: Chih-Ming Hung, Taipei (TW)

(73) Assignee: EGALAX_EMPIA TECHNOLOGY INC., Taipei City (TW)

( * ) Notice: Subject to any disclaimer, the term of this patent is extended or adjusted under 35 U.S.C. 154(b) by 0 days.

(21) Appl. No.: 19/258,966

(22) Filed: Jul. 3, 2025

(65) Prior Publication Data

US 2026/0009840 A1 Jan. 8, 2026

(30) Foreign Application Priority Data

Jul. 8, 2024 (TW) ................................ 113125498

(51) Int. Cl.
*G01R 31/28* (2006.01)
*G06F 3/041* (2006.01)
*G06F 3/044* (2006.01)

(52) U.S. Cl.
CPC ....... *G01R 31/2837* (2013.01); *G06F 3/0416* (2013.01); *G06F 3/0446* (2019.05)

(58) Field of Classification Search
CPC .. G01R 31/2837; G06F 3/0446; G06F 3/0416
See application file for complete search history.

(56) References Cited

U.S. PATENT DOCUMENTS 10,088,940 B1 * 10/2018 Dabell .................. G06F 3/0488
2008/0162996 A1 * 7/2008 Krah ..................... G06F 3/0445 345/173
2010/0220064 A1 * 9/2010 Griffin .................. G06F 3/0418 345/173
2011/0073384 A1 * 3/2011 Osoinach ............. H03K 17/962 178/18.06
2012/0050229 A1 * 3/2012 Tenuta .................. G06F 3/0445 345/178
2012/0146956 A1 * 6/2012 Jenkinson ............ G06F 3/0418 901/14

(Continued)

FOREIGN PATENT DOCUMENTS

CN 102654543 7/2014

*Primary Examiner* — Ariel A Balaoing
(74) *Attorney, Agent, or Firm* — WPAT, PC

(57) ABSTRACT

A method for determining whether a touch panel is applicable to a firmware is provided. The method comprising: obtaining a first signal value of a RC circuit corresponding to a reference point on a touch panel by a touch sensitive processing apparatus using mutual capacitance sensing; deploying a test conductive object to the reference point and obtaining a second signal value of the RC circuit by the touch sensitive processing apparatus, wherein the test conductive object and the touch sensitive processing apparatus share a common reference voltage; calculating a test variance ratio according to the first and the second signal values; and determining whether the touch panel is applicable to a range of touch sensing parameters supported by a firmware of the touch sensitive processing apparatus according to the test variation value and a first reference value.

17 Claims, 10 Drawing Sheets

(56) References Cited

U.S. PATENT DOCUMENTS

| | | | | |
|---|---|---|---|---|
| 2014/0071080 | A1* | 3/2014 | Cok | G06F 3/0418<br>345/174 |
| 2014/0278187 | A1* | 9/2014 | Rovito | G06F 3/044<br>324/750.02 |
| 2015/0049013 | A1 | 2/2015 | Rahman et al. | |
| 2015/0116267 | A1* | 4/2015 | Inoue | G06F 3/04182<br>345/174 |
| 2015/0261340 | A1* | 9/2015 | Krah | G06F 3/0445<br>345/174 |
| 2016/0328062 | A1* | 11/2016 | Jin | G06F 3/04164 |
| 2021/0191709 | A1* | 6/2021 | Cho | G06F 8/65 |
| 2024/0411404 | A1* | 12/2024 | Hung | G06F 3/0418 |

* cited by examiner

METHOD FOR DETERMINING WHETHER TOUCH PANEL IS APPLICABLE TO FIRMWARE AND TOUCH SENSITIVE PROCESSING APPARATUS AND TEST TOUCH SYSTEM THEREOF

CROSS REFERENCE TO RELATED PATENT APPLICATION

This patent application is based on a Taiwan, R.O.C. patent application No. 113125498 filed on Jul. 8, 2024.

FIELD OF THE INVENTION

The present invention relates to touch sensitive function, and more particularly, to determine whether a touch panel is applicable to an existing firmware of a touch sensitive processing apparatus.

BACKGROUND OF THE INVENTION

Touch panel is a common input and output apparatus of a modern electronic device. A common touch panel is controlled by a touch sensitive processing apparatus. And the touch sensitive processing apparatus utilizes self-capacitance or mutual-capacitance sensing via touch electrodes of the touch panel.

When being mass industrial production, there may exist errors on touch electrodes in touch panels manufactured in a same batch. Components of the AFE (analogous front-end) of the touch sensitive processing apparatuses may also have errors, too. After the touch panel and the touch sensitive processing apparatus being assembled, the errors may be further magnified. Consequently, the touch sensitive function may not be qualified as expected. However, for some touch panels without expected performance, touch sensing parameters used by the touch sensitive processing apparatus may be adjusted to make the touch sensitive function qualified in practice.

Hence, there exists a need of a method for determining whether a touch panel is applicable to an existing touch sensitive processing apparatus in order to reduce the quantity of touch panels which are mistakenly being marked as disqualified. Moreover, these touch panels can be paired to existing touch sensitive processing apparatuses to decrease the defective rate and the manufacture costs.

SUMMARY OF THE INVENTION

According to an embodiment of the present application, a method for determining whether a touch panel is applicable to a firmware is provided. The method comprising: obtaining a first signal value of a RC (resistance-capacitance) circuit corresponding to a reference point on a touch panel by a touch sensitive processing apparatus using mutual capacitance sensing; deploying a test conductive object to the reference point and obtaining a second signal value of the RC circuit by the touch sensitive processing apparatus, wherein the test conductive object and the touch sensitive processing apparatus share a common reference voltage; calculating a test variance ratio according to the first and the second signal values; and determining whether the touch panel is applicable to a range of touch sensing parameters supported by a firmware of the touch sensitive processing apparatus according to the test variation value and a first reference value.

Preferably, in order to prevent performing test on edges of the touch panel which does not have sufficient capacitance, wherein the touch panel comprises multiple first electrodes in parallel to a first axis and multiple second electrodes in parallel to a second axis, wherein the RC circuit includes one of the first electrodes which is not close to an edge of the touch panel and one of the second electrodes which is not close to another edge of the touch panel.

Preferably, in order to for the firmware to quickly find out a qualified range of touch sensing parameters when the firmware is determined being applicable the range of touch sensing parameters supported by the firmware, the method further comprises storing the test variance ratio in a data section of a non-volatile memory of the touch sensitive processing apparatus, wherein the firmware is also stored in the non-volatile memory, a checksum of the firmware is predetermined.

Preferably, in order to make the mutual capacitance sensing values corresponding to the touch electrodes more uniformly, wherein the touch sensitive processing apparatus further comprises a driving circuit module to emit a driving signal via the RC circuit and a sensing circuit module to receive the driving signal induced by the RC circuit, wherein the touch sensing parameters include one or any combination of following: signal strength of the driving signal; frequency of the driving signal; a duty cycle of the driving signal; a gain value of an amplifier of the driving circuit module; a gain value of an amplifier of the sensing circuit module; a timing difference between a transmitting timing of the driving circuit module and a sensing timing of the sensing circuit module; a sensing time duration of the sensing circuit module; and a resistance of a variable resistor of the sensing circuit module.

According to an embodiment of the present application, the recited touch sensitive processing apparatus is provided. The touch sensitive processing apparatus comprising a processor module for realizing the method for determining whether a touch panel is applicable to a firmware.

According to an embodiment of the present application, a test touch system is provided. The test touch system comprising the recited touch sensitive apparatus and the test conductive object.

According to an embodiment of the present application, a test method for finding touch sensing parameters is provided. The test method is applicable to a touch sensitive processing apparatus which is configured to perform touch sensing via a touch panel. The test method comprising: determining whether there exists touch sensing parameters stored in a data section of a non-volatile memory; and performing following steps when there is no touch sensing parameter stored in the data section: obtaining a test variance ratio of a RC (resistor-capacitance) circuit on the touch panel by the touch sensitive processing apparatus using mutual capacitance sensing; performing test to the touch panel according to touch sensing parameters corresponding to the test variance ratio to find qualified touch sensing parameters; and performing touch sensitive processing according to the qualified touch sensing parameters.

Preferably, in order to avoid unnecessary steps, e.g., tests according to a range of touch sensing parameters which is not supported by the firmware, the test method further comprises: after the test variance ratio is obtained, determining whether the touch panel is applicable to a range of touch sensing parameters supported by a firmware of the touch sensitive processing apparatus; and when the touch panel is applicable to the range of touch sensing parameters, performing said step of performing test to find qualified touch sensing parameters and said step of performing touch sensitive processing.

Preferably, in order to get the test variance ratio based on a finger or a test conductive object which shares a common reference voltage with the touch sensitive processing apparatus, wherein said step of obtaining a test variance ratio further comprises: obtaining a first signal value of the RC circuit corresponding to a reference point on the touch panel by the touch sensitive processing apparatus using mutual capacitance sensing; deploying a test conductive object to the reference point and obtaining a second signal value of the RC circuit by the touch sensitive processing apparatus, wherein the test conductive object and the touch sensitive processing apparatus share a common reference voltage; and calculating the test variance ratio according to the first and the second signal values.

Preferably, in order to prevent duplicated tests, the test method further comprises: after the qualified touch sensing parameters are found, storing the qualified touch sensing parameters in the data section.

Preferably, in order to prevent duplicated test, the test method further comprises: when the data section stores the touch sensing parameters, said touch sensitive processing is performed according to the touch sensing parameters stored in the data section.

Preferably, in order to prevent performing test on edges of the touch panel which does not have sufficient capacitance, wherein the touch panel comprises multiple first electrodes in parallel to a first axis and multiple second electrodes in parallel to a second axis, wherein the RC circuit includes one of the first electrodes which is not close to an edge of the touch panel and one of the second electrodes which is not close to another edge of the touch panel.

Preferably, in order to prevent the firmware is modified, the test method is embodied as a firmware stored in the non-volatile memory, a checksum of the firmware is predetermined.

Preferably, in order to make the mutual capacitance sensing values corresponding to the touch electrodes more uniformly, wherein the touch sensitive processing apparatus further comprises a driving circuit module to emit a driving signal via the RC circuit and a sensing circuit module to receive the driving signal induced by the RC circuit, wherein the touch sensing parameters include one or any combination of following: signal strength of the driving signal; frequency of the driving signal; a duty cycle of the driving signal; a gain value of an amplifier of the driving circuit module; a gain value of an amplifier of the sensing circuit module; a timing difference between a transmitting timing of the driving circuit module and a sensing timing of the sensing circuit module; a sensing time duration of the sensing circuit module; and a resistance of a variable resistor of the sensing circuit module.

Preferably, in order to find the qualified touch sensing parameters more quickly, wherein the qualified touch sensing parameters are look up from a predetermined table based on the test variance ratio.

Preferably, in order to find the qualified touch sensing parameters more quickly and saving memory space occupied by the table, wherein the qualified touch sensing parameters are calculated according to a function based on the test variance ratio.

According to an embodiment of the present application, the recited touch sensitive processing apparatus is provided to realize the test method.

According to an embodiment of the present application, a touch system is provided. The touch system comprises the recited the touch sensitive processing apparatus and the touch panel.

According to the various embodiments provided by the present application, the manufacturers can quickly determine whether a touch panel is applicable to an existing touch sensitive processing apparatus. Thus, it reduces the quantity of touch panels which are mistakenly being marked as disqualified. Moreover, these touch panels can be paired to existing touch sensitive processing apparatuses to decrease the defective rate and the manufacture costs.

BRIEF DESCRIPTION OF THE DRAWINGS

The advantages and spirit related to the present invention can be further understood via the following detailed description and drawings.

DETAILED DESCRIPTION OF THE PREFERRED EMBODIMENT

Figure 1:
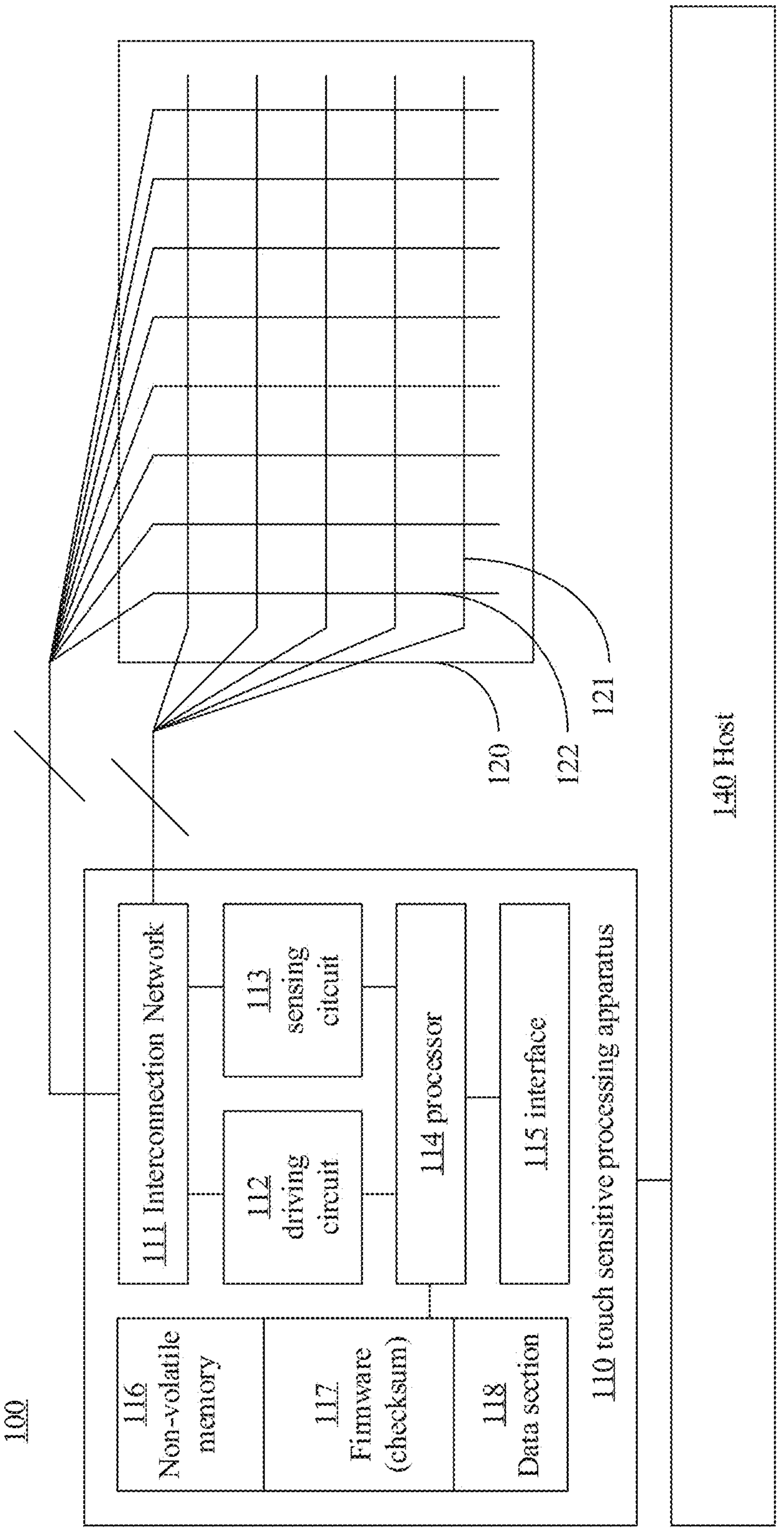
FIG. 1 depicts a block diagram of a touch system 100 in accordance with an embodiment of the present application.

Some embodiments of the present application are described in details below. However, in addition to the description given below, the present invention can be applicable to other embodiments, and the scope of the present invention is not limited by such rather by the scope of the claims. Moreover, for better understanding and clarity of the description, some components in the drawings may not necessary be drawn to scale, in which some may be exaggerated related to others, and irrelevant. If no relation of two steps is described, their execution order is not bound by the sequence as shown in the flowchart diagram.

The terms “first”, “second”, “third” and etc. recited in the specification, claims and drawings of the instant application are used to distinguish similar objects, not to specify a sequence or an order. It may be understood that the objects being described in that manner can be interchangeable under appropriate circumstances. In the specification of the instant application, the meaning of "a plurality" explicitly refers to two or more, unless they are specifically defined. In addition, the terms "comprise" and "include" and any other equivalents of these terms are intended to be non-exclusively. Some blocks as shown in the drawings may be functional entities, which may not directly correspond to physical or logical entities. The function entities may be implemented in a form of software, in one or more hardware circuits or integrated circuits, or in different networks, different processor devices or different micro controllers.

In the description of the instant application, it is noted that the terms "installed", "coupled" and "connecting" should be interpreted in the broadest reasonable way, unless they are otherwise defined or limited explicitly. For examples, two may be fixed connected, attachable connected, or jointly connected; mechanically connected, electrically coupled, or communicably connected; directly connected or indirectly connected via intermediates; or interconnected inside the two components or interactively correspondence of the two components. For persons having ordinary skill in the art, he/she can understand what the terms mean substantially in the specification based on the circumstances.

In order to make the purpose, features and advantages of the present application more obvious and easier to understand, below in conjunction with the figures and the specific embodiments are described in further detail to the present application.

Please refer to FIG. 1, which depicts a block diagram of a touch system 100 in accordance with an embodiment of the present application. The touch sensitive system 100 may be a common desktop, laptop, tablet personal computer, industrial control computer, smartphone or any other computer system fulfilling touch sensitive functions.

The touch system 100 may comprise a touch sensitive processing apparatus 110, a touch panel or screen 120 which connects to the touch sensitive processing apparatus 110, and a host 140 which connects to the pressure sensitive processing apparatus 110. The touch system 100 may further comprise one or more styli 130 and/or one or more touch board erasers 135. Hereinafter the present application, the touch panel or screen 120 may be referred as touch screen 120. However, in the embodiments which are lack of display functionality, person having ordinary skill in the art can understand the so-called touch screen is a touch panel per se.

The touch panel 120 comprises multiple first electrodes 121 in parallel to a first axis and multiple second electrodes 122 in parallel to a second axis. The first electrodes 121 intersect with the second electrodes 122 to form multiple sensing points or areas. Similarly, the second electrodes 122 intersect with the first electrodes 122 to form multiple sensing points or areas. In some embodiments, the first electrodes 121 may be referred to as first touch electrodes 121; the second electrodes 122 may be referred to as second touch electrodes 122. Collectively, the first electrodes 121 and the second electrodes 122 are referred to as touch electrodes. In some embodiments involving the touch panel 120, the first electrodes 121 and the second electrodes 122 are made of transparent materials. The first electrodes 121 and the second electrodes 122 may be in the same electrode layer where conductive plates of each of the first electrodes 121 or the second electrodes 122 are connected by bridging. The first electrodes 121 and the second electrodes 122 may be disposed in two overlapping electrode layers. Unless described specifically, the present application may be applicable to the embodiments include single electrode layer and the embodiments include multiple electrode layers. The first axis and the second axis are usually perpendicular to each other. However, the present application does not limit that the first axis must be perpendicular to the second axis. In one embodiment, the first axis may be a horizontal axis or a refresh axis of the touch panel 120. The first electrodes 121 and/or the second electrodes 122 may include multiple conductive sheets or conductive plates. Person having ordinary skill in the art may refer to multiple patent applications of the Applicant to understand various embodiments of the first electrodes 121 and/or the second electrodes 122.

The touch sensitive processing apparatus 110 may comprise following hardware circuit modules: an interconnection network module 111, a driving circuit module 112, a sensing circuit module 113, a processor module 114, an interface module 115, and non-volatile memory 116. The touch sensitive processing apparatus 110 may be implemented in a single chip of integrated circuits, which may encapsulate one or more dies. The touch sensitive processing apparatus 110 may be implemented by multiple chips of integrated circuits and a circuit board connecting these chips. The touch sensitive processing apparatus 110 may be implemented in the same chip which comprise the host 140. In other words, the application does not limit how the touch sensitive processing apparatus 110 implements.

The interconnection network module 111 is configured to connect one or more first electrodes 121 and/or the second electrodes 122 of the touch panel 120, respectively. The interconnection network module 111 may receive control commands of the processor module 114 for connecting the driving circuit module 112 with any one or more touch electrodes and for connecting the sensing circuit module 113 with any one or more touch electrodes. The interconnection network module 111 may comprise a combination of one or more multiplexers to fulfill the mentioned functions.

The driving circuit module 112 may comprise clock generator, frequency divider, frequency multiplier, phase lock loop, power amplifier, DC-DC voltage converter, regulator and/or filter, which is configured to provide driving signal to any one or more touch electrodes via the interconnection network module 111 according to control commands of the processor module 114. The driving signal may be modulated by kinds of analog or digital modulations for carrying some messages. The modulations include but not limit to frequency modulation (FM), phase modulation, amplitude modulation, dual sideband modulation (DSB), single sideband module (SSB-AM), vestigial sideband modulation, amplitude shift keying (ASK), phase shift keying (PSK), quadrature amplitude modulation (QAM), frequency shift keying (FSK), continuous phase modulation (CPM), code division multiple (CDMA), time division multiple access (TDMA), orthogonal frequency division multiplexing (OFDM), pulse width modulation (PWM) and etc. The driving signal may include one or more square waves, sinuous waves, or any modulated waves. The driving circuit module 112 may include one or more channel. Each channel may be connected to any one or more touch electrodes via the interconnection network module 111.

The sensing circuit module 113 may comprise integrator, sampler, clock generator, frequency divider, frequency multiplier, phase lock loop, power amplifier, operational amplifier, DC-DC voltage converter, regulator and/or filter, which is configured to sense on any one or more touch electrodes via the interconnection network module 111 according to control commands of the processor module 114. When the touch signal is transmitted from one of the touch electrodes, another touch electrode may induce the touch signal. And the sensing circuit module 113 may demodulate the induced touch signal by another touch electrode in accordance with the modulation method performed on the driving signal by the driving circuit module 112 in order to restore the messages carried by the driving signal. The sensing circuit module 113 may include one or more channels. Each channel may be connected to any one or more touch electrodes via the interconnection network module 111. At the same time, each channel may simultaneously perform sensing and demodulation.

In one embodiment, the driving circuit module 112 and the sensing circuit module 113 may include analog front-end (AFE) circuits. In another embodiment, in additional to the AFE circuits, the driving circuit module 112 and the sensing circuit module 113 may include digital back-end (DBE) circuits. If the driving circuit module 112 and the sensing circuit module 113 include only the AFE circuits, the DBE circuits may be implemented in the processor module 114.

The processor module 114 may include a digital signal processor for connecting the AFE circuits or the DBE circuits of the driving circuit module 112 and the sensing circuit module 113, respectively. The processor module 114 may include an embedded processor, non-volatile memories, and volatile memories. Normal or real-time operating system (OS) and their application programs may be stored in the non-volatile memories. The OS and the application programs include multiple instructions and data. The processor (including the embedded processor and the digital signal processor) may execute the instructions for controlling other modules including the interconnection network module 111, the driving circuit module 112, the sensing circuit module 113 and the interface module 115 of the pressure sensitive processing apparatus 110. For examples, the processor module 114 may comprises processors widely adopted in the industry such as 8051 series, Intel i960 series, ARM Cortex-M series and etc. The present application does not limit types and numbers of processor cores included in the processor module 114.

The instructions and data may be used to implement each of steps mentioned in the present application and flows and methods constructed by the steps. Some instructions may be executed independently inside the processor module 114, for examples, arithmetic and logic operation instructions. Other instructions may be used to control other circuits of the touch sensitive processing apparatus 110. These instructions may include input/output interfaces of the processor module 114 to control other circuits. Other circuits may provide information via the input/output interface of the processor module 114 to the OS and/or application programs executed by the processor module 114. Persons having ordinary skill in the art should have common knowledge of computer organization and architecture which enabling them to understand that the flows and methods provided by the present application can be realized by the circuits and the instructions.

The interface module 115 may include kinds of serial or parallel bus, such as universal serial bus (USB), $I^2C$, peripheral component interconnect (PCI), PCI-Express, IEEE 1394 and other industrial standard input/output interface. The touch sensitive processing apparatus 110 connects to the host 140 via the interface module 115.

The non-volatile memory 116 may include readable and writable memory such as EEPROM or flash memory. Content in the memory can be preserved when power is lost. The processor module 114 can load and execute firmware 117 stored in the non-volatile memory 116 for realizing touch sensitive functionalities. The firmware 117 may include a real-time operating system, instructions, and program for the operations of the processor module 114. In one embodiment, the program and data in the firmware enables the touch sensitive processing apparatus 110 to implement the embodiments provided by the present application.

The non-volatile memory 116 may include a data section 118. As its name explains, the data section stores only data, not instructions. After the firmware 117 is loaded by the processor module 114, predetermined touch sensing parameters can be loaded. These touch sensing parameters may include but are not limited to signal strength (magnitude, or voltage and/or current of the driving circuits), frequency, duty cycle of the driving signal, a gain of an amplifier of the driving circuit module 112, a gain of an amplifier of the sensing circuit module 113, a sensing timing of the sensing circuit module 113 with respect to an emitting timing of the driving signal (it may be referred to as a timing difference or a phase difference), a sensing duration of the sensing circuit module 113 (or being equivalent to a number of sampling), a resistance of a variable resistor of the sensing circuit module 113 etc.

These touch sensing parameters may be corresponding to an operating range of hardware of the driving circuit module 112 and the sensing circuit module 113. The firmware 117 may be used to determine whether the data section 118 includes the qualified touch sensing parameters. When it is determined the data section includes the qualified touch sensing parameters, the firmware 117 would load the touch sensing parameters in the data section 118 to replace the default touch sensing parameters.

In one embodiment, the firmware 117 may include one or a set of touch sensing parameters as default values. However, the default values of the one or a set of touch sensing parameters may not be suitable for the touch panel 120. Hence, the firmware 117 can support a range of touch sensing parameters. If the default values are not suitable for the touch panel 120, the firmware 117 may find one or a set of qualified touch sensing parameters in the supported range. Afterward, the one or the set of qualified touch sensing parameters may be used for touch sensitive processing.

The range of touch sensing parameters supported by the firmware 117 may be smaller than another range of touch sensing parameters supported by the hardware. For example, the touch sensing parameters may include a voltage value of the driving signal. When the hardware of the touch sensitive processing apparatus 110 supports up to 10 volts, the range of touch sensing parameters supported by the firmware 117 may support up to 9 volts in order to preserve some margins in case a manufacturing defect occurs so as 10 volts cannot be achieved. Persons having ordinary skill in the art can understand that a range of the touch sensing parameters supported by the firmware may be smaller than another range of the touch sensing parameters supported by the hardware. The default touch sensing parameters of the firmware are of course in the range of the touch sensing parameters supported by the firmware.

The touch sensitive processing apparatus 110 can detect one or more external conductive objects such as human fingers, palms, passive styli 130 or touch board erasers 135 via the touch panel 120. It can also detect a stylus 130 or a touch board eraser 135 which transmits electric signals. The touch sensitive processing apparatus 110 can use mutual-capacitance or self-capacitance principles to detect the external conductive objects.

The host 140 is a main apparatus for controlling the touch system 100. It may comprise an input/output interface module for connecting the interface module, a central processing unit (CPU) module, a graphics processor module, a memory module connects to the CPU module, a network interface module and a storage module connect to the input/output interface module. The CPU module may comprise one or more processor or processor cores. Common processors may include Intel, AMD, VIA's x86 and x64 instruction set architecture (ISA) processors, Apple, Qualcomm, MediaTek's ARM ISA processors, or any other types of complex instruction set computer (CISC) or reduced instruction set computer (RISC) processors. The OS and application programs include multiple instructions and data corresponding to the instruction set. By executing these instructions, the CPU module is able to control other modules of the touch system 100.

Figure 2:
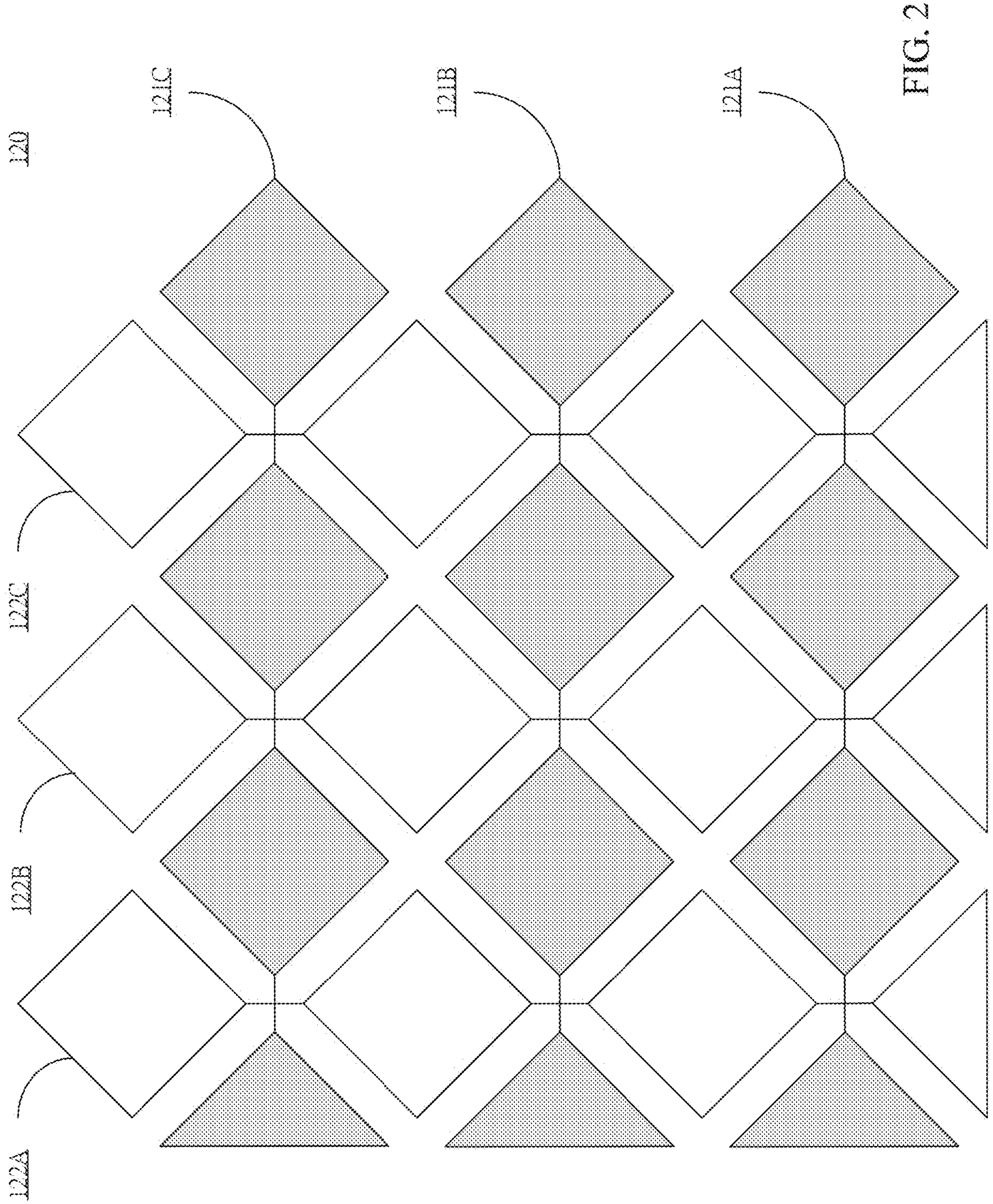
FIG. 2 depicts a lower left corner of the touch panel 120 as shown in FIG. 1.

Please refer to FIG. 2, which depicts a lower left corner of the touch panel 120 as shown in FIG. 1. The touch panel 120 may comprise multiple first electrodes 121 in parallel to a first axis (e.g., the horizontal axis as shown in FIG. 2) and multiple second electrodes 122 in parallel to a second axis (e.g., the vertical axis as shown in FIG. 2). As shown in FIG. 2, the touch panel 120 includes the bottom first electrode 121 and two first electrodes 121B and 121C. Each of the first electrodes 121 may include multiple conductive sheets or plates, for examples, they may be in rhombic or diamond shape. Person having ordinary skill in the art can understand that the electrode may not include conductive sheets or plates. For example, the first electrodes 121 and the second electrodes 122 may be simply elongated rectangular electrodes. However, the ending sheet of each first electrode 121 is a half shape. Similarly, the touch panel 120 includes the most left second electrode 122A and two second electrodes 122B and 122C. Each of the second electrodes 122 may include multiple conductive sheets or plates, for examples, they may be in rhombic or diamond shape. However, the ending sheet of each second electrode 122 is a half shape. Conductive sheets of each electrode are connected by circuits. The ending sheets are connected to the interconnection network module 111 of the touch sensitive processing apparatus 110 via circuits.

The first electrode 121 closest to the bottom edge of the touch panel 120 may be referred to as peripheral first electrode 121. The other first electrode 121 closest to the top edge of the touch panel 120 may be also referred to as peripheral first electrode 121. Similarly, the two second electrodes 122 closest to another two opposite edges of the touch panel 120 are referred to as peripheral second electrodes 122. These four electrodes are collective referred to as peripheral electrodes or peripheral touch electrodes. A non-peripheral electrode has a neighboring parallel electrode in each side. Because capacitance of the capacitor formed by the peripheral electrodes near the edges are less than the capacitances of the capacitors formed by those non-peripheral electrodes, the peripheral electrodes are different from the non-peripheral electrodes.

The touch panel 120 may have a single electrode layer or two overlapping electrode layers. When there is only one electrode layer, the circuits connecting the conductive sheets of the first electrodes 121 cross over the circuits of the second electrodes 122. Reversely, the circuits connecting the conductive sheets of the second electrodes 122 may cross over the circuits of the first electrodes 121. When there are two electrode layers, no circuit bridges are required.

When performing mutual capacitance sensing, the driving circuit module 112 can transmit driving signals to the first electrode 121 via the interconnection network module 111. The emitted driving signals would be induced at each of the second electrodes 122. The induced driving signals would be propagated to the sensing circuit module 113 via the interconnection network module 111. The propagation path of the driving signal may be viewed as a RC circuit. Because each of the peripheral electrodes of the touch panel only has one neighboring parallel electrode, and non-peripheral electrodes has parallel neighboring electrodes in two opposite sides, the capacitances corresponding to the peripheral electrodes are insufficient comparing with non-peripheral electrodes.

Figure 3:
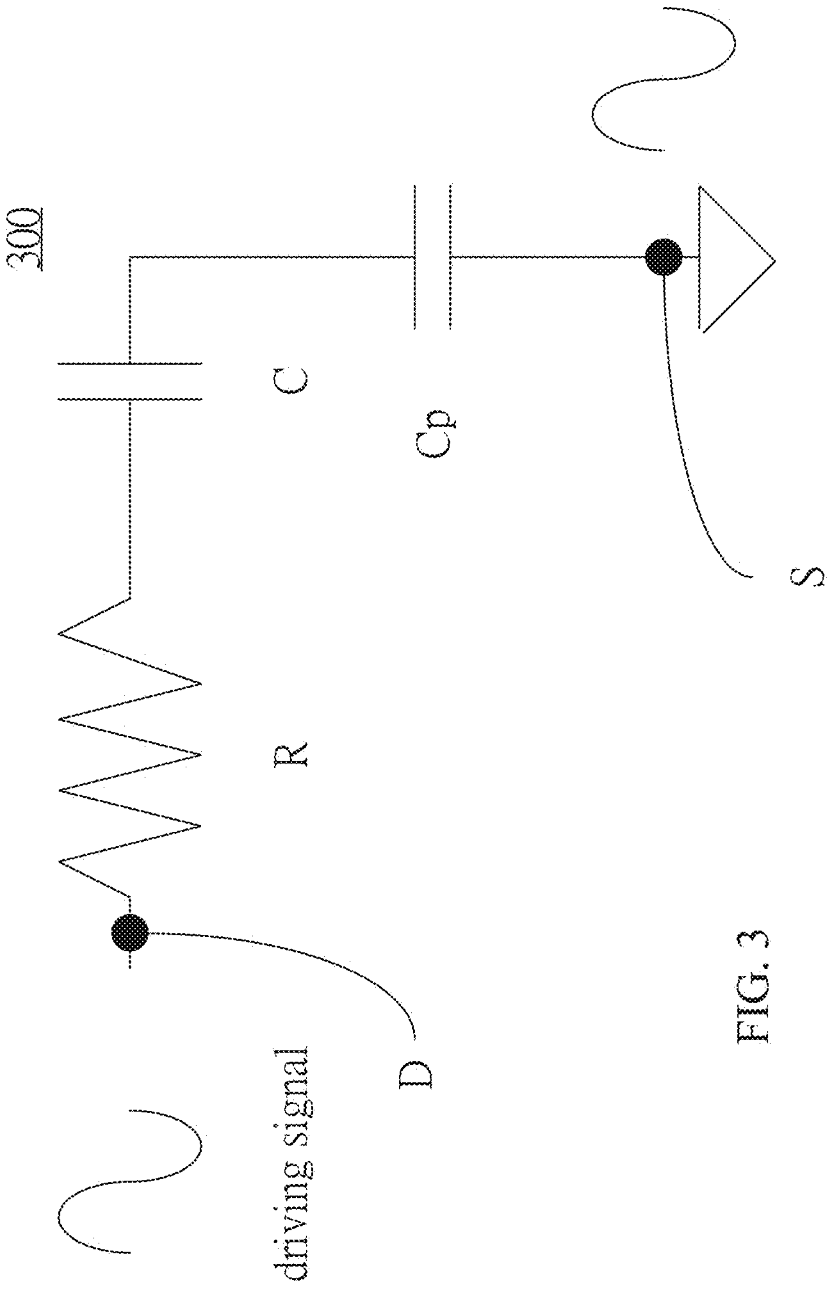
FIG. 3 depicts a RC circuit 300 during mutual capacitance sensing in accordance with an embodiment of the present application.

Please refer to FIG. 3, which depicts a RC circuit 300 during mutual capacitance sensing in accordance with an embodiment of the present application. The propagation path of the driving signals may be viewed as a circuit 300, which comprises a resistor R, a capacitor C, and a capacitor Cp between the conductive sheets or electrodes. The circuit 300 may be a combination of one of the first electrodes 121 and one of the second electrodes 122.

The driving signals provided by the driving circuit module 112 enters the RC circuit at point D. The sensing circuit module 113 senses the driving signals at point S. The touch sensitive processing apparatus 110 obtains a sensing signal value corresponding to the point S based on the touch sensing parameters. The sensing signal value is with respect to a basis direct current voltage or a common reference voltage, usually the ground voltage. The touch sensitive processing apparatus 110 may connect to the basis direct current voltage or the common reference voltage via a ground circuit. And the basis direct current voltage of the touch system 100 may be equivalent to the basis direct current voltage or common reference voltage of a user via connection to a power outlet or ground line.

Person having ordinary skill in the art can understand that it is possible to obtain identical sensing signal values corresponding to a same circuit 300 based on two different sets of touch sensing parameters. In case that two different circuits having different resistances and capacitances, it is possible to respectively obtain identical sensing signal values corresponding to these two different circuits 300 based on a same set of touch sensing parameters. Hence, even when a sensing signal value is corresponding to two different circuits 300, the capacitance values of the capacitors of these two different circuits 300 may be different.

Figure 4:
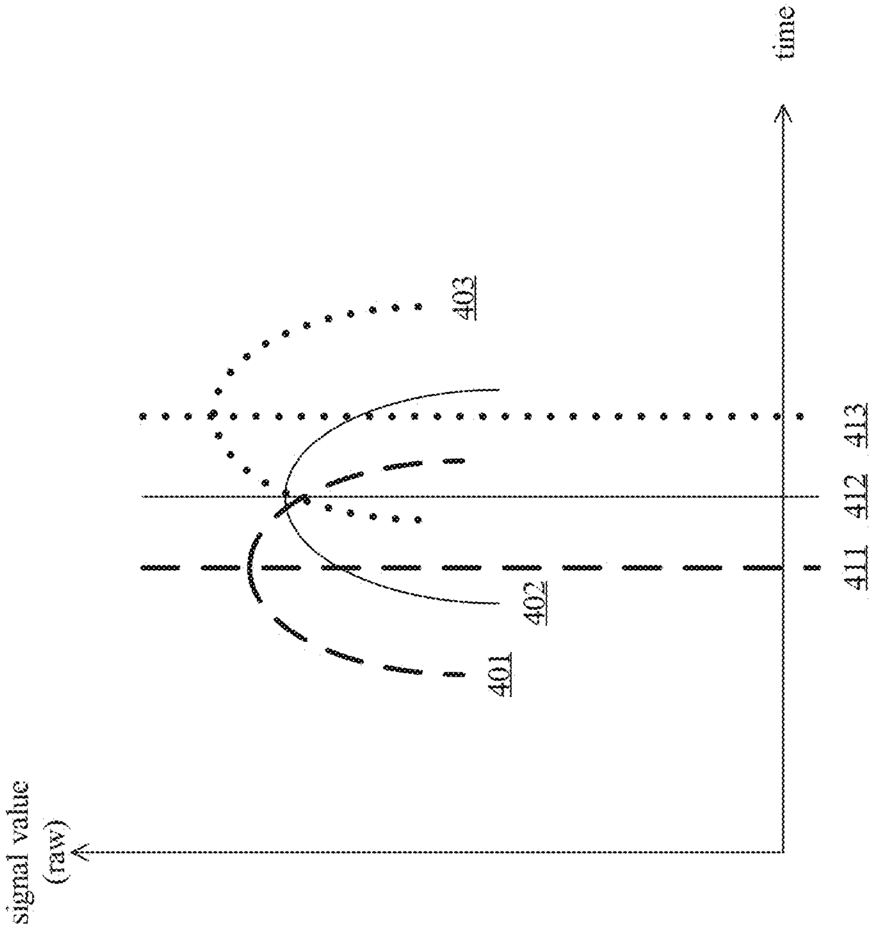
FIG. 4 depicts a diagram of a relationship between the sensing signal and timing difference in accordance with an embodiment of the present application.

Please refer to FIG. 4, which depicts a diagram of a relationship between the sensing signal and timing difference in accordance with an embodiment of the present application. The horizonal axis as shown in FIG. 4 represents the sensing time of the sensing circuit module 113. The vertical axis as shown in FIG. 4 represents signal strength of the sensing signals. Based on a same set of touch sensing parameters to perform sensing with respect to three RC circuits 300, three maximum values with respect to three driving signals 401, 402, and 403 are at timing point 411, 412, and 413, respectively. Moreover, these three maximum values are not identical.

Certified firmware 117 and calibrated touch sensing parameters are configured to correspond to a touch panel 120 without approached or touched external conductive objects such that sensed signal values with respect to every RC circuit 300 of the touch panel 120 are fallen into an acceptable range. As discussed above, in case that two RC circuits 300 having different resistances and capacitances, it is possible to get identical sensing signal values to perform sensing on these two RC circuits 300 based on a same set of touch sensing parameters. Since the resistance of the resistor R and the capacitance of the capacitor C of each RC circuit 300 are roughly the same, in case there exists an external conductive object approaching or touching the touch panel, the capacitance of the capacitor Cp of each RC circuit 300 is the most influenced variable.

As indicated above, the capacitances of the capacitors Cp of each RC circuit 300 of the touch panels 120 manufactured in different batches are different. The variations of the capacitances may be resulted from the material and the thickness of glass, the alignment errors of overlapping electrode layers, the distances between overlapping electrode layers, material of the touch electrodes, and areas of conductive sheets of the touch electrodes etc. Among the touch panels 120 manufactured in a same batch, the variations of the capacitances of the capacitors are smaller. However, among the touch panels 120 manufactured in different batches, the variations of the capacitances of the capacitors are larger. Therefore, the capacitances of the capacitors of these touch panels 120 may be out of a range of touch sensing parameters supported by the certified firmware 117. Hence, assuming that the resistance of the resistor R and the capacitance of the capacitor C of each RC circuit 300 are roughly the same, one of the inventive features provided by the present application is to determine whether one or more capacitances of one or more capacitors Cp of the RC circuits 300 have too large variations by utilizing a test tool which share a common reference voltage with the touch sensitive processing apparatus 110.

Figure 5:
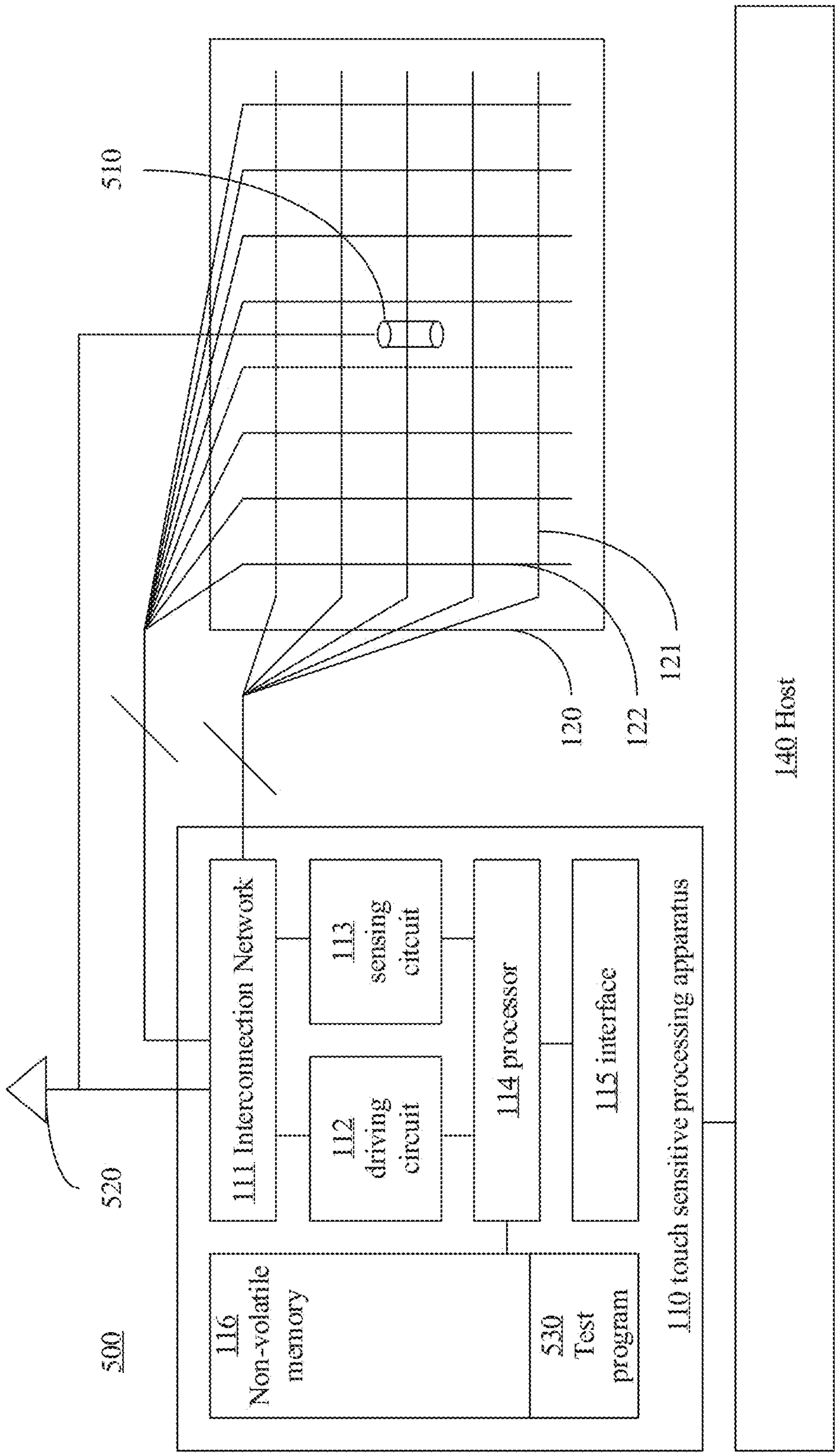
FIG. 5 illustrates a block diagram of a test touch system 500 in accordance with an embodiment of the present application.

Please refer to FIG. 5, which illustrates a block diagram of a test touch system 500 in accordance with an embodiment of the present application. Comparing with the touch system 100 as shown in FIG. 1, the test touch system 500 as shown in FIG. 5 comprises one or more test conductive objects 510. The test conductive objects 510 are used to simulate human fingers' touches to the touch panel 120. The test conductive object 510 may be a cylinder of copper or metal for touching in the middle of the touch panel 120. The test conductive objects 510 may share a basis direct current voltage or a common reference voltage with the touch sensitive processing apparatus 110. In one embodiment, the test conductive objects may connect to the ground voltage of the touch sensitive processing apparatus 110 via a circuit. In an alternative embodiment, the test conductive objects may connect to the ground voltage of the test touch system 500 via a circuit. The non-volatile memory 116 may include a test program for testing.

Figure 6:
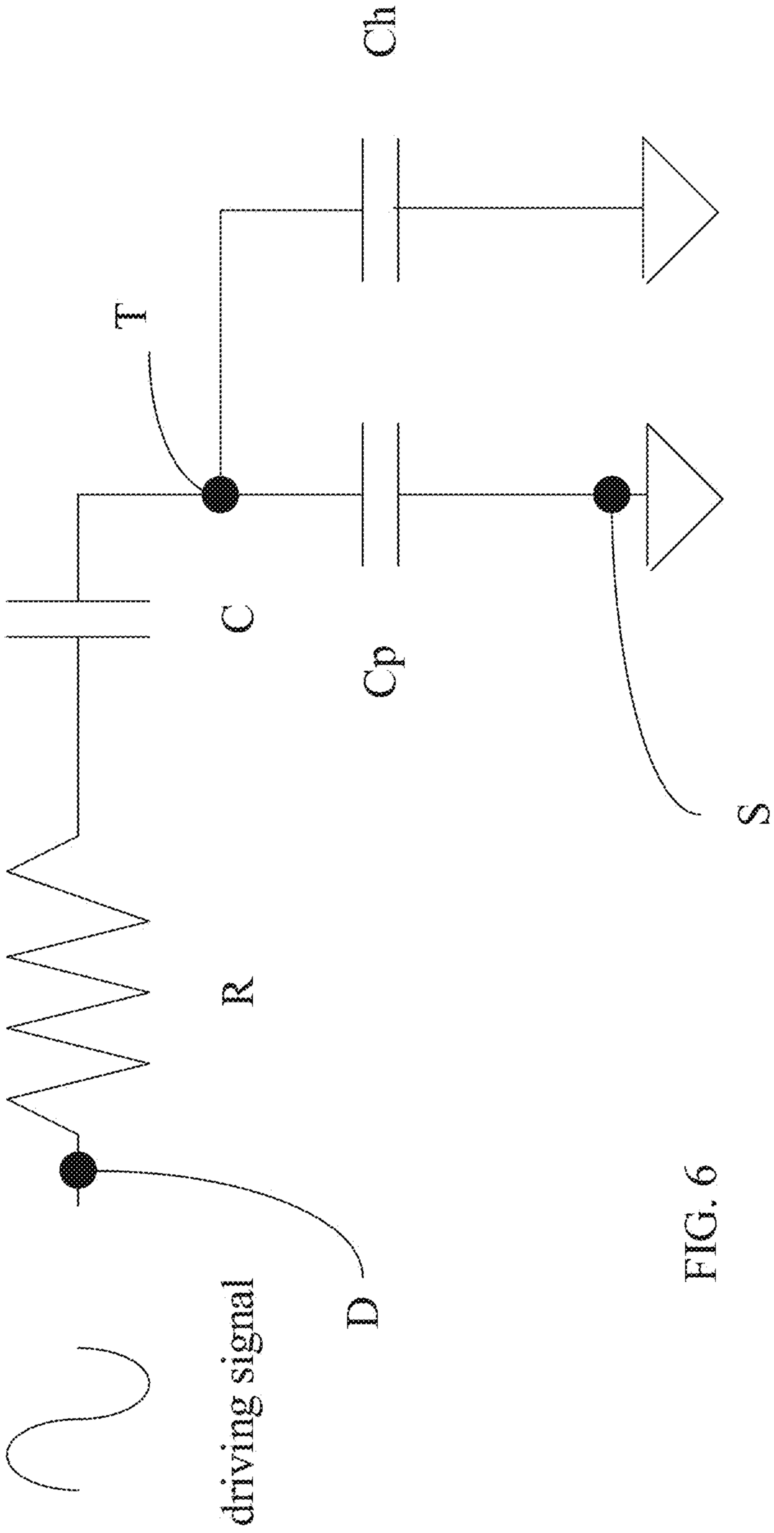
FIG. 6 depicts a diagram of a RC circuit 600 when mutual capacitance sensing is performed to test the test conductive object 510 in accordance with an embodiment of the present application.

Please refer to FIG. 6, which depicts a diagram of a RC circuit 600 when mutual capacitance sensing is performed to test the test conductive object 510 in accordance with an embodiment of the present application. Comparing with the RC circuit 300 as shown in FIG. 3, the RC circuit 600 which is approached or touched by the test conductive object 510 further comprises a capacitor Ch, which may be considered being in parallel with the capacitor Cp between the conductive sheets or plates. The capacitor Ch is formed between the test conductive object 510 and the electrodes. Partial electric charges of the driving signals pass through the test conductive object 510 at the reference point T to the common reference voltage 520. Hence, the electric charges sensed by the sensing circuit module 113 at the point S becomes less. The sensed signal value decreases.

Figure 7:
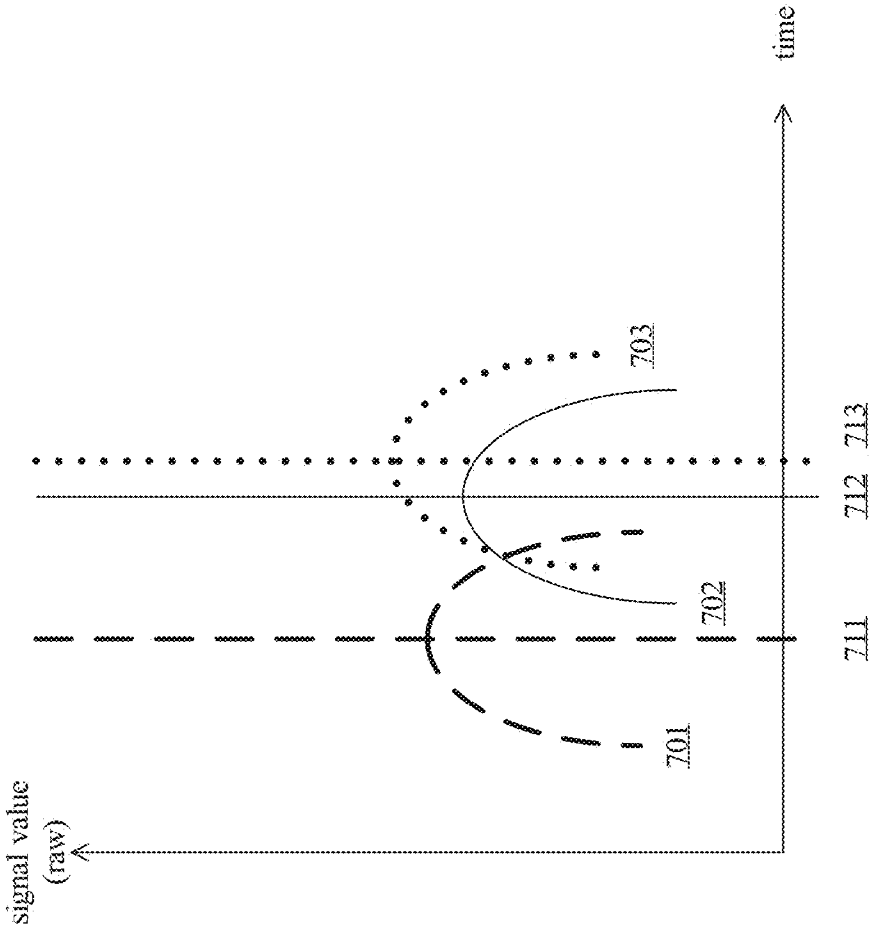
FIG. 7 illustrates a diagram of the relationship between the sensed signal and timing with respect to the test conductive object 510 in accordance with an embodiment of the present application.

Please refer to FIG. 7, which illustrates a diagram of the relationship between the sensed signal and timing with respect to the test conductive object 510 in accordance with an embodiment of the present application. Similar to FIG. 4, the horizontal axis as shown in FIG. 7 represents a sensing time duration of the sensing circuit module 113. The vertical axis represents the strength of the sensed signal. Based on a same set of touch sensing parameters to perform sensing on these three RC circuits 600. There are three maximum values of the three driving signals 701, 702, and 703 at the timing 711, 712, and 713, respectively. And their maximum values are not identical. As discussed above, because partial charges of the driving signals propagate to the ground via the test conductive object 510, the timing and strength of the driving signals at the point S differ.

Figure 8:
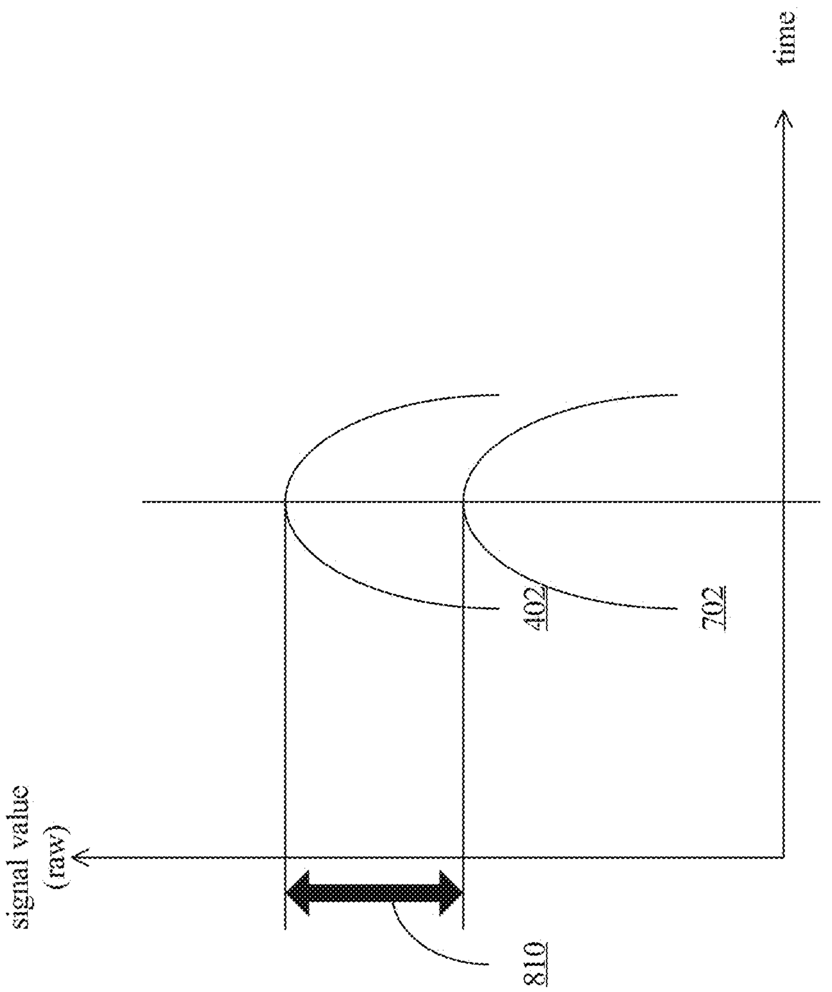
FIG. 8 illustrates variations of signals of circuits with respect to the test conductive object 510 in accordance with an embodiment of the present application.

Please refer to FIG. 8, which illustrates variations of signals of circuits with respect to the test conductive object 510 in accordance with an embodiment of the present application. Based on a same set of touch sensing parameters to perform sensing on the RC circuit 600 which is approached or touched by the test conductive object 510, the test program 530 may sense original signal values or first signal values of the driving signals 402 when the test conductive object 510 does not approach or touch the touch panel 120; and the test program 530 may sense test signal values or second signal values of the driving signals 702 when the test conductive object 510 approaches or touches the touch panel 120. The differences of these two are referred to as a test variation 810. A ratio of signal values of the driving signal 702 and the driving signal 402 is a test variation ratio. It is also equivalent to a ratio between the first and second signal values. Because the capacitor Ch caused by the test conductive object 510 is fixed, the test variation value is corresponding to the capacitance of the capacitor Cp.

Although in the present application, it takes the ratio between the first and second signal values as the test variation ratio, persons having ordinary skill in the art can understand that any ratio corresponding to the first and the second signal values can be used to represent the test variation ratio. For examples, the test variation ratio may be selected from the first signal value/the second signal value, the second signal value/the first signal value, the second signal value/(the first signal value+the second signal value), the first signal value/(the first signal value+the second signal value), (the first signal value−the second signal value)/(the first signal value+the second signal value), and (the second signal value−the first signal value)/(the first signal value+the second signal value).

In one embodiment, a test can be performed by using single one test conductive object 510 approaching or touching the touch panel 120. In an alternative embodiment, considering the length of the RC circuit 600, another test can be performed by using multiple test conductive objects 510 approaching or touching different positions of the touch panel 120. For example, the test can be performed on one or any combination of four corner points of the touch panel 120. The corner points are corresponding to intersection of two of the top, the bottom, the most left, and the rightest ones of the non-peripheral electrodes. As mentioned above, the capacitances of the capacitors Cp corresponding to the peripheral electrodes are not identical to ones corresponding to the non-peripheral electrodes. Hence, the test may be performed on a RC circuit 600 formed by a non-peripheral first electrode and a non-peripheral second electrode.

In additional to determine whether the touch panel is applicable to the existing firmware 117, the capacitance of the capacitor Cp can be estimated according to the test variation ratio or the test variation based on the resistance of the resistor R, the capacitance of the capacitor C, and the capacitance of the capacitor Ch of the RC circuit 600. After the resistance and the capacitances of the RC circuit 600 are obtained, one or more touch sensing parameters can be adjusted accordingly.

When the test variation ratio or the test variation of one of the test points is less than a first reference value, it is determined that the touch panel is applicable to an existing certified firmware version. And the certified firmware version is able to select some touch sensing parameters to perform test calibration according to the test variation ratio or the test variation. For example, one or more tables can be prepared in advanced. When other kinds of the touch sensing parameters are preset, a table of one kind of touch sensing parameter with respect to the test variation ratio and the test variation can be established. For example, a table of timing difference parameters between the timings of transmitting driving signal and the sensing timing with respect to the test variation ratios can be established. The firmware 117 can select a timing difference parameter corresponding to a test variation ratio according to the table to perform test calibration. In another example, another table of gain values of the amplifier of the driving circuit module with respect to the test variation ratios can be established. The firmware 117 can select a gain value of the amplifier of the driving circuit module corresponding to a test variation ratio according to the other table to perform test calibration. In addition to the tables, a function with respect to the test variation ratio may be used to obtain one or more values of one or more kinds of touch sensing parameters.

When multiple test conductive objects are used in test, multiple test variation ratios can be obtained, respectively. The firmware 117 can select values of touch sensing parameters corresponding to the test variation ratios to test calibration.

In case that a set of touch sensing parameters is selected to perform test and the obtained test signal values are fallen into an acceptable range. The selected set of touch sensing parameters may be stored in the data section 118 in the non-volatile memory 116. Afterward, the firmware 117 may load the stored set of touch sensing parameters for use in touch sensing.

Figure 9:
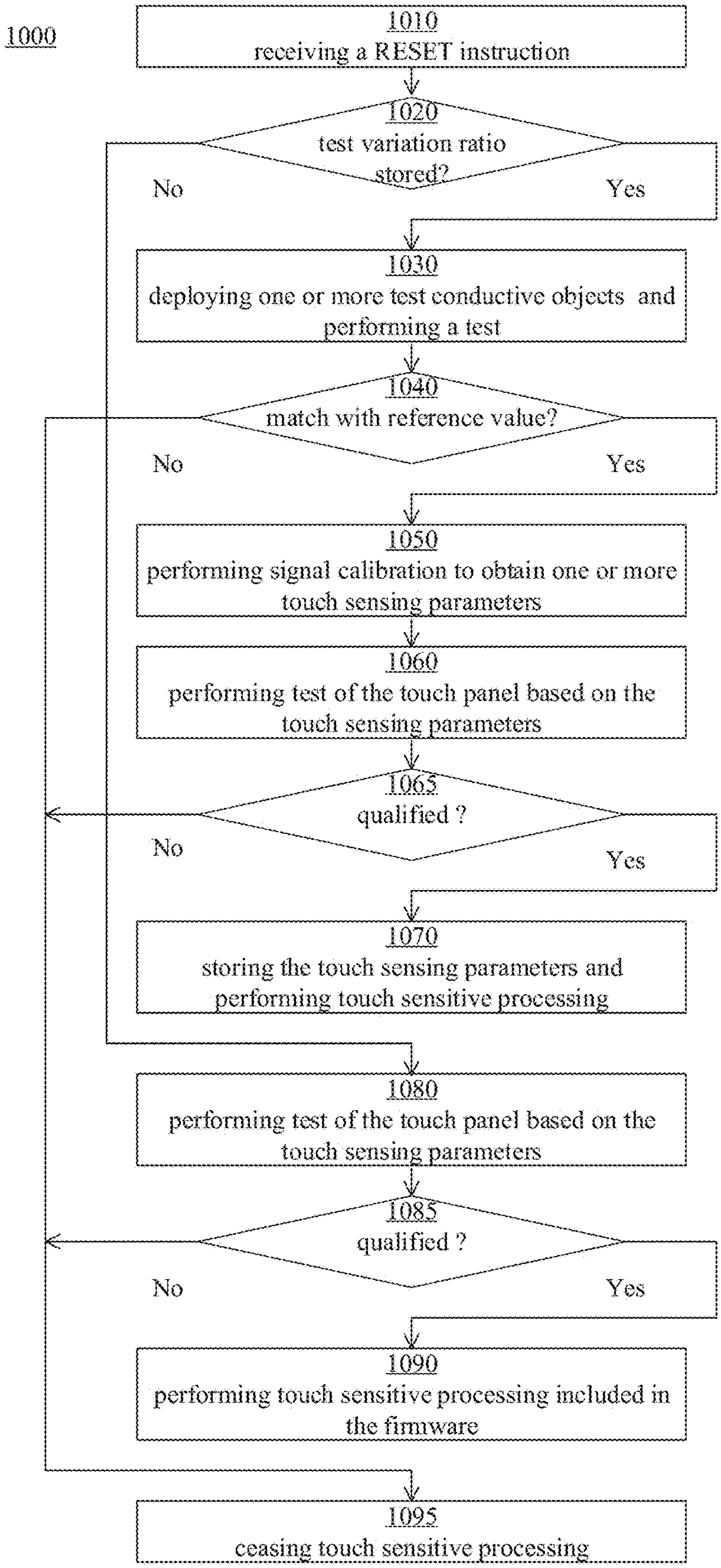
FIG. 9 depicts a flowchart diagram of a test method 1000 for finding touch sensing parameters.

Please refer to FIG. 9, which depicts a flowchart diagram of a test method 1000 for finding touch sensing parameters. The test method 1000 for finding touch sensing parameters can be applied to the embodiments of the touch system 100 as shown in FIG. 1. The test method 1000 may be embodied as the firmware 117 consisting of instructions and data. When the firmware 117 is loaded by the processor module 114, the instructions are executed to realize the test method 1000 for finding touch sensing parameters by the touch sensitive processing apparatus 110. If there is no direct or indirect relationship between any two steps, the present application does not limit the execution precedence of these two steps. The method 1000 for finding touch sensing parameters may begin at step 1010.

Step 1010: receiving a RESET instruction. The touch sensitive processing apparatus 110 may receive a RESET instruction from software or a RESET signal from hardware. When the touch sensitive processing apparatus 110 receives a RESET instruction, the firmware 117 stored in the non-volatile memory 116 is loaded. In one embodiment, the checksum of firmware 117 is identical to the predetermined checksum. In one embodiment, the flow may proceed to the optional step 1020 or to the step 1030.

Optional step 1020: determining whether there exists a test variation ratio and its corresponding reference value(s) in the data section 118 or in the firmware 117. If there exists a test variation ratio and its corresponding reference value (s), the flow may proceed to step 1030. Otherwise, the step may proceed to step 1080.

Step 1030: deploying one or more test conductive objects, which share a common reference voltage (e.g., ground voltage) with the touch sensitive processing apparatus 110 or the touch system 100 and performing a test for obtaining the test variation ratio in order to obtain a calibrated test variation ratio. In one embodiment, the one or more test conductive objects with the common reference voltage are deployed to one or more reference points on the touch panel 120, and one or more test variation ratios with respect to the one or more reference points are obtained based on mutual capacitance sensing. Next, the flow proceeds to step 1040.

Step 1040: determining whether the one or more test variation ratios match with their corresponding reference values. In one embodiment, the step may further comprises determining whether the test variation ratio obtained at step 1030 differ from the test variation ratio stored in the data section 118 or the firmware 117 too much. In case all the test variation ratios obtained at step 1030 match with their corresponding reference values or the differences between the test variation ratios obtain at step 1030 and the test variation ratios stored in the data section 118 or the firmware 117 are smaller than a reference threshold, the flow may proceed to step 1050. Otherwise, the flow proceeds to step 1095.

Step 1050: performing signal calibration to obtain one or more touch sensing parameters. In one embodiment, a test for finding qualified touch sensing parameters of the touch panel 120 is performed based on the one or more test variation ratios and a table with test variation ratios and corresponding touch sensing parameters. Next, the flow may proceed to step 1060.

Step 1060: performing test of the touch panel based on the touch sensing parameters found at said step of signal calibration. Next, the flow may proceed to step 1065.

Step 1065: determining whether a result of the test done at the step 1060 is qualified or not. If it is determined qualified, the flow proceeds to step 1070. If it is not determined qualified, the flow proceeds to step 1095.

Step 1070: storing the one or more sets of touch sensing parameters obtained at step 1050 in the data section 118 and performing touch sensitive processing via the touch panel 120. In one embodiment, the test variation ratio and its corresponding reference value obtained at step 1030 may be also stored in the data section 118.

Step 1080: performing test of the touch panel based on the touch sensing parameters included in the firmware 117. Next, the flow may proceed to step 1085.

Step 1085: determining whether a result of the test done at the step 1080 is qualified or not. If it is determined qualified, the flow proceeds to step 1090. If it is not determined qualified, the flow proceeds to step 1095.

Step 1090: performing touch sensitive processing included in the firmware 117 via the touch panel.

Step 1095: ceasing touch sensitive processing. Because it is lack of qualified touch sensing parameters, no touch sensing processing is required.

Figure 10:
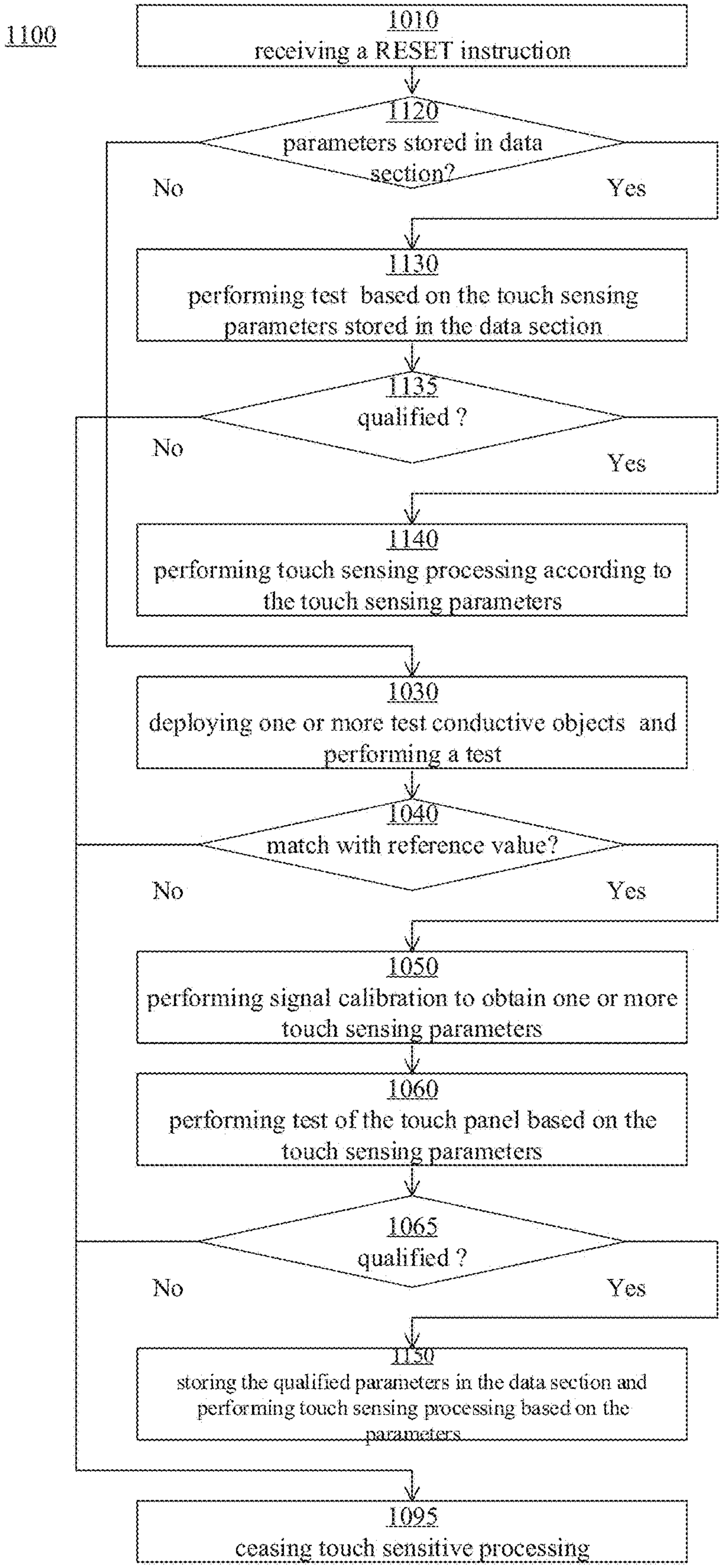
FIG. 10 illustrates a flowchart diagram of a test method 1100 for finding touch sensing parameters in accordance with another embodiment of the present application.

Please refer to FIG. 10, which illustrates a flowchart diagram of a test method 1100 for finding touch sensing parameters in accordance with another embodiment of the present application. The test method 1100 for finding touch sensing parameters may be applicable to the touch system 100 as shown in FIG. 1. The test method 1100 may be embodied as the firmware 117 consisting of instructions and data. When the firmware 117 is loaded by the processor module 114, the instructions are executed to realize the test method 1100 for finding touch sensing parameters by the touch sensitive processing apparatus 110. If there is no direct or indirect relationship between any two steps, the present application does not limit the execution sequence of these two steps.

The test method 1100 for finding touch sensing parameters reuses some steps provided in the test method 1000. No more elaborations of these steps are provided here. The test method 1100 for finding touch sensing parameters may begin at the step 1010. After the step 1010, the flow may proceed to step 1120.

Step 1120: determining whether there exist touch sensing parameters stored in the data section 118. When the data section 118 stores touch sensing parameters, the flow may proceed to optional step 1130. Or assuming that the stored touch sensing parameters are qualified, the flow may directly proceed to the step 1140. Otherwise, the flow may proceed to the step 1030.

Step 1130: performing test of the touch panel based on the touch sensing parameters stored in the data section. Next, the flow may proceed to step 1135.

Step 1135: determining whether a result of the test done at the step 1130 is qualified or not. If it is determined qualified, the flow proceeds to step 1140. If it is not determined qualified, the flow proceeds to step 1095.

Step 1140: performing touch sensing processing according to the touch sensing parameters. Th flow may end here.

When it is determined that there exists no touch sensing parameter in the data section 118 at the step 1120, the flow may proceed to the step 1030 to obtain one or more test variation ratios. When it is determined that the obtained test variation ratios match with their corresponding reference vales, the flow proceeds to step 1050. Next, a signal calibration is done at the step 1050 to obtain touch sensing parameters. After the touch sensing parameters are obtained, a determination of whether the touch sensing parameters are qualified or not at the step 1060 and the step 1065. When it is determined that the touch sensing parameters are qualified, the flow proceeds to step 1150. When it is determined that the touch sensing parameters are disqualified, the flow proceeds to step 1095.

Step 1150: storing the qualified touch sensing parameters in the data section 118 and performing touch sensing processing based on the touch sensing parameters.

According to an embodiment of the present application, a method for determining whether a touch panel is applicable to a firmware is provided. The method comprising: obtaining a first signal value of a RC (resistance-capacitance) circuit corresponding to a reference point on a touch panel by a touch sensitive processing apparatus using mutual capacitance sensing; deploying a test conductive object to the reference point and obtaining a second signal value of the RC circuit by the touch sensitive processing apparatus, wherein the test conductive object and the touch sensitive processing apparatus share a common reference voltage; calculating a test variance ratio according to the first and the second signal values; and determining whether the touch panel is applicable to a range of touch sensing parameters supported by a firmware of the touch sensitive processing apparatus according to the test variation value and a first reference value.

Preferably, in order to prevent performing test on edges of the touch panel which does not have sufficient capacitance, wherein the touch panel comprises multiple first electrodes in parallel to a first axis and multiple second electrodes in parallel to a second axis, wherein the RC circuit includes one of the first electrodes which is not close to an edge of the touch panel and one of the second electrodes which is not close to another edge of the touch panel.

Preferably, in order to for the firmware to quickly find out a qualified range of touch sensing parameters when the firmware is determined being applicable the range of touch sensing parameters supported by the firmware, the method further comprises storing the test variance ratio in a data section of a non-volatile memory of the touch sensitive processing apparatus, wherein the firmware is also stored in the non-volatile memory, a checksum of the firmware is predetermined.

Preferably, in order to make the mutual capacitance sensing values corresponding to the touch electrodes more uniformly, wherein the touch sensitive processing apparatus further comprises a driving circuit module to emit a driving signal via the RC circuit and a sensing circuit module to receive the driving signal induced by the RC circuit, wherein the touch sensing parameters include one or any combination of following: signal strength of the driving signal; frequency of the driving signal; a duty cycle of the driving signal; a gain value of an amplifier of the driving circuit module; a gain value of an amplifier of the sensing circuit module; a timing difference between a transmitting timing of the driving circuit module and a sensing timing of the sensing circuit module; a sensing time duration of the sensing circuit module; and a resistance of a variable resistor of the sensing circuit module.

According to an embodiment of the present application, the recited touch sensitive processing apparatus is provided. The touch sensitive processing apparatus comprising a processor module for realizing the method for determining whether a touch panel is applicable to a firmware.

According to an embodiment of the present application, a test touch system is provided. The test touch system comprising the recited touch sensitive apparatus and the test conductive object.

According to an embodiment of the present application, a test method for finding touch sensing parameters is provided. The test method is applicable to a touch sensitive processing apparatus which is configured to perform touch sensing via a touch panel. The test method comprising: determining whether there exists touch sensing parameters stored in a data section of a non-volatile memory; and performing following steps when there is no touch sensing parameters stored in the data section: obtaining a test variance ratio of a RC (resistor-capacitance) circuit on the touch panel by the touch sensitive processing apparatus using mutual capacitance sensing; performing test to the touch panel according to touch sensing parameters corresponding to the test variance ratio to find qualified touch sensing parameters; and performing touch sensitive processing according to the qualified touch sensing parameters.

Preferably, in order to avoid unnecessary steps, e.g., tests according to a range of touch sensing parameters which is not supported by the firmware, the test method further comprises: after the test variance ratio is obtained, determining whether the touch panel is applicable to a range of touch sensing parameters supported by a firmware of the touch sensitive processing apparatus; and when the touch panel is applicable to the range of touch sensing parameters, performing said step of performing test to find qualified touch sensing parameters and said step of touch sensitive processing.

Preferably, in order to get the test variance ratio based on a finger or a test conductive object which shares a common reference voltage with the touch sensitive processing apparatus, wherein said step of obtaining a test variance ratio further comprises: obtaining a first signal value of the RC circuit corresponding to a reference point on the touch panel by the touch sensitive processing apparatus using mutual capacitance sensing; deploying a test conductive object to the reference point and obtaining a second signal value of the RC circuit by the touch sensitive processing apparatus, wherein the test conductive object and the touch sensitive processing apparatus share a common reference voltage; calculating the test variance ratio according to the first and the second signal values.

Preferably, in order to prevent duplicated tests, the test method further comprises: after the qualified touch sensing parameters are found, storing the qualified touch sensing parameters in the data section.

Preferably, in order to prevent duplicated test, the test method further comprises: when the data section stores the touch sensing parameters, said touch sensitive processing is performed according to the touch sensing parameters stored in the data section.

Preferably, in order to prevent performing test on edges of the touch panel which does not have sufficient capacitance, wherein the touch panel comprises multiple first electrodes in parallel to a first axis and multiple second electrodes in parallel to a second axis, wherein the RC circuit includes one of the first electrodes which is not close to an edge of the touch panel and one of the second electrodes which is not close to another edge of the touch panel.

Preferably, in order to prevent the firmware is modified, the test method is embodied as a firmware stored in the non-volatile memory, a checksum of the firmware is predetermined.

Preferably, in order to make the mutual capacitance sensing values corresponding to the touch electrodes more uniformly, wherein the touch sensitive processing apparatus further comprises a driving circuit module to emit a driving signal via the RC circuit and a sensing circuit module to receive the driving signal induced by the RC circuit, wherein the touch sensing parameters include one or any combination of following: signal strength of the driving signal; frequency of the driving signal; a duty cycle of the driving signal; a gain value of an amplifier of the driving circuit module; a gain value of an amplifier of the sensing circuit module; a timing difference between a transmitting timing of the driving circuit module and a sensing timing of the sensing circuit module; a sensing time duration of the sensing circuit module; and a resistance of a variable resistor of the sensing circuit module.

Preferably, in order to find the qualified touch sensing parameters more quickly, wherein the qualified touch sensing parameters are look up from a predetermined table based on the test variance ratio.

Preferably, in order to find the qualified touch sensing parameters more quickly and saving memory space occupied by the table, wherein the qualified touch sensing parameters are calculated according to a function based on the test variance ratio.

According to an embodiment of the present application, the recited touch sensitive processing apparatus is provided to realize the test method.

According to an embodiment of the present application, a touch system is provided. The touch system comprises the recited the touch sensitive processing apparatus and the touch panel.

According to the various embodiments provided by the present application, the manufacturers can quickly determine whether a touch panel is applicable to an existing touch sensitive processing apparatus. Thus, it reduces the quantity of touch panels which are mistakenly being marked as disqualified. Moreover, they can be paired to existing touch sensitive processing apparatuses to decrease the defective rate and the manufacture costs.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for determining whether a touch panel is applicable to a firmware, wherein the method comprising:

obtaining a first signal value of a RC (resistance-capacitance) circuit corresponding to a reference point on a touch panel by a touch sensitive processing apparatus using mutual capacitance sensing;

deploying a test conductive object to the reference point and obtaining a second signal value of the RC circuit by the touch sensitive processing apparatus, wherein the test conductive object and the touch sensitive processing apparatus share a common reference voltage;

calculating a test variance ratio according to the first and the second signal values; and determining whether the touch panel is applicable to a range of touch sensing parameters supported by a firmware of the touch sensitive processing apparatus according to the test variation value and a first reference value.

2. The method as recited in claim 1, wherein the touch panel comprises multiple first electrodes in parallel to a first axis and multiple second electrodes in parallel to a second axis, wherein the RC circuit includes one of the first electrodes which is not close to an edge of the touch panel and one of the second electrodes which is not close to another edge of the touch panel.

3. The method as recited in claim 1, further comprises storing the test variance ratio in a data section of a non-volatile memory of the touch sensitive processing apparatus, wherein the firmware is also stored in the non-volatile memory, a checksum of the firmware is predetermined.

4. The method as recited in claim 1, wherein the touch sensitive processing apparatus further comprises:

a driving circuit module to emit a driving signal via the RC circuit; and a sensing circuit module to receive the driving signal induced by the RC circuit, wherein the touch sensing parameters include one or any combination of following:

signal strength of the driving signal;

frequency of the driving signal;

a duty cycle of the driving signal;

a gain value of an amplifier of the driving circuit module;

a gain value of an amplifier of the sensing circuit module;

a timing difference between a transmitting timing of the driving circuit module and a sensing timing of the sensing circuit module;

a sensing time duration of the sensing circuit module; and a resistance of a variable resistor of the sensing circuit module.

5. A touch sensitive processing apparatus, comprising a processor module for executing instructions stored in non-volatile memory to fulfill the test method as recited in claim 1.

6. A test touch system, comprising the touch sensitive processing apparatus and the test conductive object as recited in claim 5.

7. A test method for finding touch sensing parameters, wherein said test method is applicable to a touch sensitive processing apparatus which is configured to perform touch sensing via a touch panel, wherein the test method comprising:

determining whether there exists touch sensing parameter stored in a data section of a non-volatile memory; and performing following steps when there is no touch sensing parameter stored in the data section:

obtaining a test variance ratio of a RC (resistor-capacitance) circuit on the touch panel by the touch sensitive processing apparatus using mutual capacitance sensing, wherein said step of obtaining a test variance ratio further comprises:

obtaining a first signal value of the RC circuit corresponding to a reference point on the touch panel by the touch sensitive processing apparatus using mutual capacitance sensing;

deploying a test conductive object to the reference point and obtaining a second signal value of the RC circuit by the touch sensitive processing apparatus, wherein the test conductive object and the touch sensitive processing apparatus share a common reference voltage; and calculating the test variance ratio according to the first and the second signal values;

performing test to the touch panel according to touch sensing parameters corresponding to the test variance ratio to find qualified touch sensing parameters; and performing touch sensitive processing according to the qualified touch sensing parameters.

8. The test method as recited in claim 7, further comprises:

after the test variance ratio is obtained, determining whether the touch panel is applicable to a range of touch sensing parameters supported by a firmware of the touch sensitive processing apparatus; and when the touch panel is applicable to the range of touch sensing parameters, performing said step of performing test to find qualified touch sensing parameters and said step of performing touch sensitive processing.

9. The test method as recited in claim 7, further comprises:

after the qualified touch sensing parameters are found, storing the qualified touch sensing parameters in the data section.

10. The test method as recited in claim 7, further comprises:

when the data section stores the touch sensing parameters, said touch sensitive processing is performed according to the touch sensing parameters stored in the data section.

11. The test method as recited in claim 7, wherein the touch panel comprises multiple first electrodes in parallel to a first axis and multiple second electrodes in parallel to a second axis, wherein the RC circuit includes one of the first electrodes which is not close to an edge of the touch panel and one of the second electrodes which is not close to another edge of the touch panel.

12. The test method as recited in claim 7, wherein the test method is embodied as a firmware stored in the non-volatile memory, a checksum of the firmware is predetermined.

13. The test method as recited in claim 7, wherein the touch sensitive processing apparatus further comprises:

a driving circuit module to emit a driving signal via the RC circuit; and a sensing circuit module to receive the driving signal induced by the RC circuit, wherein the touch sensing parameters include one or any combination of following:

signal strength of the driving signal;

frequency of the driving signal;

a duty cycle of the driving signal;

a gain value of an amplifier of the driving circuit module;

a gain value of an amplifier of the sensing circuit module;

a timing difference between a transmitting timing of the driving circuit module and a sensing timing of the sensing circuit module;

a sensing time duration of the sensing circuit module; and a resistance of a variable resistor of the sensing circuit module.

14. The test method as recited in claim 7, wherein the qualified touch sensing parameters are look up from a predetermined table based on the test variance ratio.

15. The test method as recited in claim 7, wherein the qualified touch sensing parameters are look up from a predetermined table based on the test variance ratio.

16. A touch sensitive processing apparatus, comprising a processor module for executing instructions stored in non-volatile memory to fulfill the test method as recited in claim 7.

17. A touch system, comprising: the touch sensitive processing apparatus and the touch panel as recited in claim 16.

* * * * *